(12) United States Patent
Trenz

(10) Patent No.: US 11,197,364 B2
(45) Date of Patent: Dec. 7, 2021

(54) DAMPING ARRANGEMENT FOR POWER ELECTRONICS APPLICATIONS

(71) Applicant: ZF Friedrichshafen AG, Friedrichshafen (DE)

(72) Inventor: Ivonne Trenz, Pegnitz (DE)

(73) Assignee: ZF FRIEDRICHSHAFEN AG, Friedrichshafen (DE)

( * ) Notice: Subject to any disclaimer, the term of this patent is extended or adjusted under 35 U.S.C. 154(b) by 0 days.

(21) Appl. No.: 16/971,640

(22) PCT Filed: Feb. 5, 2019

(86) PCT No.: PCT/EP2019/052711
§ 371 (c)(1),
(2) Date: Aug. 20, 2020

(87) PCT Pub. No.: WO2019/162078
PCT Pub. Date: Aug. 29, 2019

(65) Prior Publication Data
US 2020/0383201 A1  Dec. 3, 2020

(30) Foreign Application Priority Data

Feb. 22, 2018 (DE) .................... 10 2018 202 659.9

(51) Int. Cl.
*H05K 7/00* (2006.01)
*H05K 1/02* (2006.01)
(Continued)

(52) U.S. Cl.
CPC .......... *H05K 1/0213* (2013.01); *B60L 15/007* (2013.01); *G01R 19/0046* (2013.01);
(Continued)

(58) Field of Classification Search
CPC ................. H05K 1/0213; H05K 1/181; H05K 2201/0753; H05K 2201/10151;
(Continued)

(56) References Cited

U.S. PATENT DOCUMENTS 7,630,807 B2 * 12/2009 Yoshimura ............ B60W 10/10
701/48
10,502,778 B2 * 12/2019 Putz .................... G01R 19/0046
(Continued)

FOREIGN PATENT DOCUMENTS

DE 102008012665 A1 9/2009
DE 102018202659 A1 8/2019
(Continued)

OTHER PUBLICATIONS

Written Opinion and International Search Report with English translation of International Search Report issued in PCT/EP2019/052711 dated May 3, 2019, and mailed on May 10, 2019 (13 pages).

*Primary Examiner* — Yuriy Semenenko
(74) *Attorney, Agent, or Firm* — Crowell & Moring LLP

(57) ABSTRACT

What is provided is a damping arrangement for power electronics applications having a circuit board, and a current sensor electrically connected to the circuit board, which current sensor is held in a current sensor housing, and an electrical contact pin passing through the circuit board and surrounded by the current sensor housing, wherein a damping element is arranged between the current sensor housing and the electrical contact pin.

8 Claims, 1 Drawing Sheet

Figure 1:
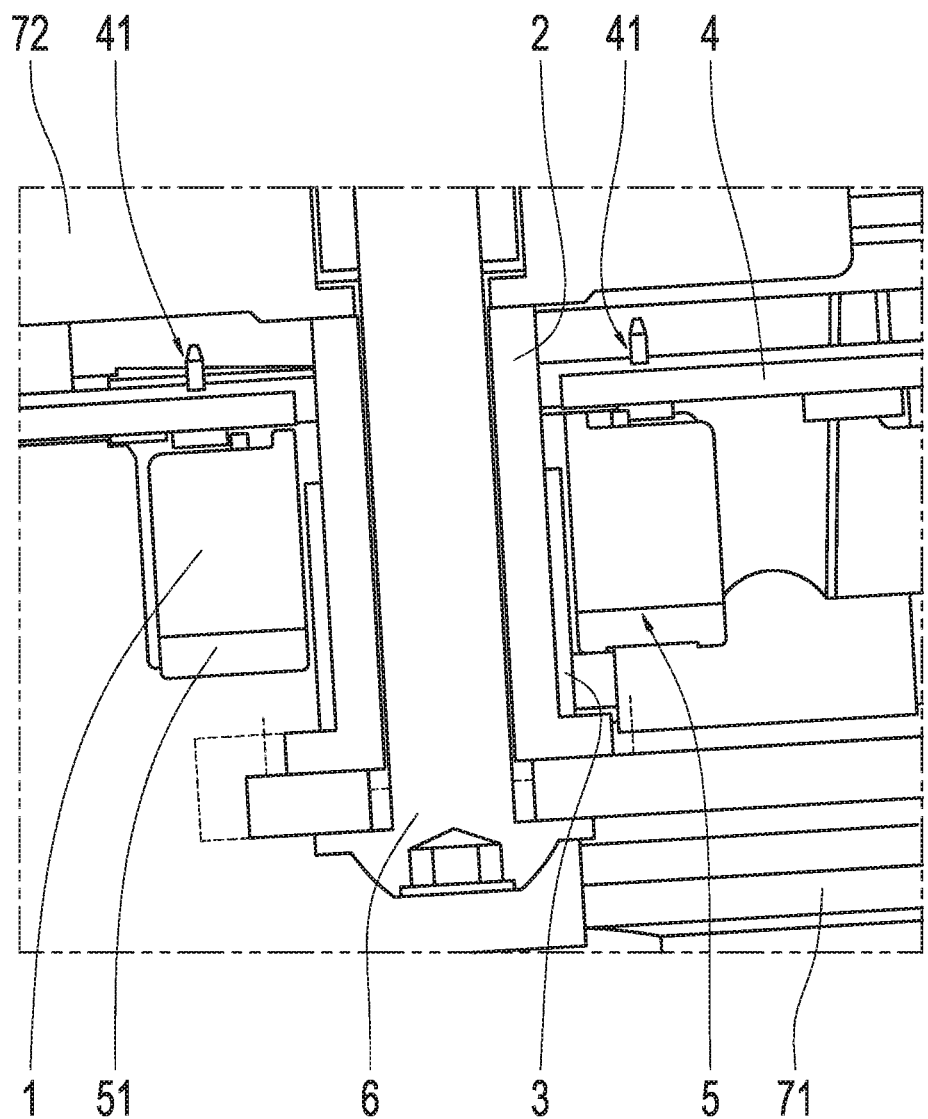

(51) Int. Cl.
  *B60L 15/00* (2006.01)
  *G01R 19/00* (2006.01)
  *H05K 1/18* (2006.01)

(52) U.S. Cl.
  CPC ..... *H05K 1/181* (2013.01); *H05K 2201/0753* (2013.01); *H05K 2201/10151* (2013.01)

(58) Field of Classification Search
  CPC ................ H05K 7/1432; B60L 15/007; B60L 2270/145; G01R 19/0046; Y02T 10/64
  See application file for complete search history.

(56) References Cited

U.S. PATENT DOCUMENTS

| | | | | |
|---|---|---|---|---|
| 2001/0022243 | A1* | 9/2001 | Weimer | B60L 50/16 180/65.1 |
| 2004/0100220 | A1* | 5/2004 | Fu | H02P 21/22 318/700 |
| 2006/0052914 | A1* | 3/2006 | Kubokawa | H05K 7/1432 701/21 |
| 2006/0232250 | A1* | 10/2006 | Sihler | H02P 29/50 322/58 |
| 2009/0236157 | A1* | 9/2009 | Akamatsu | F16D 65/18 180/55 |
| 2010/0262308 | A1* | 10/2010 | Anderson | B60G 13/14 700/287 |
| 2012/0256472 | A1* | 10/2012 | Takahashi | B60K 7/0007 301/6.5 |
| 2014/0055077 | A1* | 2/2014 | Barrass | G05B 9/02 318/700 |
| 2014/0309828 | A1* | 10/2014 | Yamazaki | B60L 3/108 701/22 |
| 2015/0151695 | A1 | 6/2015 | Oh et al. | |
| 2020/0139957 | A1* | 5/2020 | Muta | B60W 30/1884 |

FOREIGN PATENT DOCUMENTS

| | | |
|---|---|---|
| EP | 2660966 A1 | 11/2013 |
| EP | 2680680 A2 | 1/2014 |
| WO | WO 2019/162078 A1 | 8/2019 |

* cited by examiner

DAMPING ARRANGEMENT FOR POWER ELECTRONICS APPLICATIONS

CROSS-REFERENCE TO RELATED APPLICATIONS

This application is a U.S. national stage application under 35 U.S.C. § 371 of PCT Application No. PCT/EP2019/052711, filed on Feb. 5, 2019, and published as WO 2019/162078 A1 on Aug. 29, 2019, which claims priority from German Application No. DE 10 2018 202 659.9, filed on Feb. 22, 2018, the entirety of which are each hereby fully incorporated by reference herein.

The present invention relates to a damping arrangement for power electronics applications.

The following abbreviations are used:
AC stands for alternating current.
DC stands for direct current.
LV stands for low voltage.
HV stands for high voltage.

Various designs are known for power electronics applications for axle drives. By way of example, there are LV AC current sensors with a single-part housing. Due to the low diameter for HV electrical contact pins, that is to say due to the reduced cross section, less current is however able to be transferred, or more self-heating is generated.

Two-part housings are used at present for the LV current sensor, in which the cross section in this region is significantly reduced in order to maintain the air gap and creepage paths between the LV current sensor and the HV electrical contact pin. In order to create the required air gap and creepage paths between the LV current sensor and the HV electrical contact pin, an additional plastic part may furthermore be latched into the current sensor for insulation purposes. As a result of the small spacings between the individual components, this design however leads, in the event of vibrational loading, to wear between the individual components, and may have results as severe as the failure of individual components, including the LV current sensor.

One object of this invention is therefore to provide a damping arrangement for power electronics applications by way of which the abovementioned problems are overcome. This object is achieved by the features of the independent patent claim. Advantageous refinements are the subject matter of the dependent claims.

What is provided is a damping arrangement for power electronics applications having a circuit board, and a current sensor electrically connected to the circuit board, which current sensor is held in a current sensor housing, and an electrical contact pin passing through the circuit board and surrounded by the current sensor housing, wherein a damping element is arranged between the current sensor housing and the electrical contact pin.

As a result of using a damping element, vibrational loading is reduced especially between the electrical contact pin and the current sensor, meaning that the likelihood of failure is reduced. At the same time, less space is required than in known applications.

In one embodiment, the damping element is fastened on the electrical contact pin. Mounting is thus made easier.

In one embodiment, the damping element is formed of an electrically insulating material or an electrically non-insulating material. In one embodiment, the damping element is formed of an elastomer. In one embodiment, the damping element is formed of an electrically insulating material having a hardness value of less than or equal to 50 SHORE A. Depending on the application, different materials may be used in order for example to be manufactured using a preferred manufacturing method, for example injection molding. The hardness of the material and the electrically conductive properties may also be selected depending on the application.

In one embodiment, the current sensor housing is formed in two parts. It is thus made possible for example to exchange the current sensor.

In one embodiment, the damping element completely surrounds the electrical contact pin. The fact that the electrical contact pin is completely surrounded avoids the formation of undesired creepage paths.

In one embodiment, the electrical contact pin has a cavity for receiving a fastening means for the mutual fastening of components provided on different sides of the circuit board. Providing an area for fastening means makes it possible to save space and allows efficient fastening without influencing the electrical properties.

Further features and advantages of the invention will become apparent from the following description of exemplary embodiments of the invention with reference to the figures of the drawing, which shows the details of the invention, and from the claims. The individual features may each be implemented on their own or together in any desired combination in one variant of the invention.

Preferred embodiments of the invention will be explained in more detail below with reference to the appended drawing.

FIG. 1 shows a view of a damping arrangement for power electronics applications according to one embodiment of the present invention.

The proposed damping arrangement for power electronics applications is advantageously used for axle drives. It is advantageously used in at least partly electrically or fully electrically driven vehicles.

The aim of the invention is to reduce or even to avoid vibrational loading between the current sensor, more precisely between the current sensor housing 1 that surrounds the current sensor or in which the current sensor is arranged, and the electrical contact pin 2. Another aim is to achieve lower loading resulting from vibrational excitations for the connection points 41 between the current sensor and the circuit board 4, which connection points are generally designed as solder points. The likelihood of failure of the components is thus also reduced.

In the application in the field of power electronics for axle drives, described below in the form of an exemplary embodiment, the current sensor channels a low voltage and is thus an LV current sensor, and the electrical contact pin channels a high voltage and is thus an HV electrical contact pin.

Vibrational loading occurs primarily when components or component parts rub against one another for example due to movements or vibrational excitations. This may give rise to abrasion. This may lead to damage to or failure of individual components or component parts, with results as severe as the failure of the entire power electronics. In the arrangement described here, the current sensor 2 may especially fail and the connection points 41 between the current sensor and the circuit board 4 may be loaded due to vibrational excitations. The connection points 41 advantageously protrude from the current sensor housing 1 in the form of pins, such that they are able to be plugged through corresponding openings in the circuit board 4 and be soldered thereto.

As is illustrated by way of example in FIG. 1, the current sensor housing 1 may be designed in two parts, wherein the division 5 is made such that one part serves as cover 51, such that the current sensor arranged inside the current sensor housing 1 is able to be exchanged, for example. A single-part design is likewise possible.

In order to achieve improved protection against vibrational loading, a damping element 3 is arranged between the electrical contact pin 2 and the current sensor housing 1, as illustrated in FIG. 1. This damping element is designed such that it contributes to damping the vibrational excitation between the current sensor housing 1 and the electrical contact pin 2. As a result of the damping properties, it may furthermore also serve to provide better protection against vibrational loading for the connection points 41 between the current sensor and the circuit board 4. This thus achieves a reduction in wear and avoids component failures, without in the process impairing the required air gap and creepage paths between the HV electrical contact pin 2 and the LV current sensor in the region of the current sensor housing 1 from being maintained. Insulation between high voltage HV and low voltage LV may also be provided by selecting a suitable non-conductive material.

The damping element 3 is advantageously provided completely around the electrical contact pin 2 and attached there. This additional material is fastened on the electrical contact pin 2, for example through a mounting process such as adhesive bonding, a two-component injection-molding process, or attached in another way. Mounting is thus simplified. This additional material has a damping and insulating property in order to create the air gap and creepage paths between the current sensor in the current sensor housing 1 and the HV electrical contact pin 2. The applied material additionally damps the movement of the components, in particular of the current sensor housing 1 with respect to the electrical contact pin 2, but the connection points 41 between the current sensor and the circuit board 4 are also protected against undesired loading, meaning that wear is thus reduced and component failures are more effectively prevented.

The material that is used for the damping element 3 is preferably an elastomer whose hardness value is defined using what is known as the SHORE hardness. The SHORE hardness is an identifier that is generally used to specify hardness for elastomers and rubber-elastic polymers. It is thus a measure of material hardness, and may thus be referred to as a strength value. The material of the damping element 3 for the present invention is generally what is known as a soft elastomer, meaning that the SHORE A hardness should be used as a measure of the hardness value of the material. In one embodiment, a material having a SHORE A hardness of less than or equal to 50 is used as material for the damping element 3. The thickness and length of the damping element 3 is selected by a person skilled in the art depending on the electrical contact pin 2 and the current sensor housing 1 that are used.

By virtue of arranging a damping element 3 on the electrical contact pin 2 such that said damping element is arranged between the current sensor housing 1 and the electrical contact pin 2, lower wear between the two components 1 and 2 is achieved, as well as lower loading and less abrasion. At the same time, the solder points 41 between the current sensor and the circuit board 4 are loaded to a lesser extent, which in turn reduces the likelihood of failure.

To connect further components 71 and 72 from one side of the circuit board 4 to the other side of the circuit board 4 via the electrical contact pin 2, the electrical contact pin 2 may be designed as a hollow element. A corresponding fastening means 6 may then be routed through the cavity, for example a screw, as shown in FIG. 1. The electrical contact pin 2 may of course also be produced from a solid material.

REFERENCE SIGNS 1 current sensor housing
2 electrical contact pin
3 damping element
4 circuit board
41 current sensor to circuit board connection points
5 division of the current sensor housing
51 cover
6 fastening means
71, 72 external components

The invention claimed is:

1. A damping arrangement for power electronics applications having a circuit board, and a current sensor electrically connected to the circuit board, which current sensor is held in a current sensor housing, and an electrical contact pin passing through the circuit board and surrounded by the current sensor housing, wherein a damping element is arranged between the current sensor housing and the electrical contact pin.

2. The damping arrangement as claimed in claim 1, wherein the damping element is fastened on the electrical contact pin.

3. The damping arrangement as claimed in claim 1, wherein the damping element is formed of at least one of an electrically insulating material or an electrically non-insulating material.

4. The damping arrangement as claimed in claim 1, wherein the damping element is formed of an elastomer.

5. The damping arrangement as claimed in claim 1, wherein the damping element is formed of an electrically insulating material having a strength value of less than or equal to 50 SHORE A.

6. The damping arrangement as claimed in claim 1, wherein the current sensor housing is formed in two parts.

7. The damping arrangement as claimed in claim 1, wherein the damping element completely surrounds the electrical contact pin.

8. The damping arrangement as claimed in claim 1, wherein the electrical contact pin has a cavity for receiving a fastening means configured to fasten a first component and a second component provided on different sides of the circuit board.

* * * * *